(12) United States Patent
Takemoto et al.

(10) Patent No.: US 9,054,655 B2
(45) Date of Patent: Jun. 9, 2015

(54) TRANSIMPEDANCE AMPLIFIER

(71) Applicant: Hitachi, Ltd., Tokyo (JP)

(72) Inventors: Takashi Takemoto, Fuchu (JP); Hiroki Yamashita, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/900,763

(22) Filed: May 23, 2013

(65) Prior Publication Data

US 2013/0342275 A1   Dec. 26, 2013

(30) Foreign Application Priority Data

Jun. 21, 2012  (JP) .................................. 2012-139351

(51) Int. Cl.
*H03F 3/08* (2006.01)
*H03F 3/45* (2006.01)

(52) U.S. Cl.
CPC .............. *H03F 3/45076* (2013.01); *H03F 3/08* (2013.01); *H03F 3/087* (2013.01); *H03F 3/45179* (2013.01); *H03F 3/45744* (2013.01); *H03F 2203/45138* (2013.01); *H03F 2203/45528* (2013.01)

(58) Field of Classification Search
CPC .... H03G 1/0047; H03G 3/3084; H03F 3/087; H03F 3/082; H03F 3/085; H03F 3/08; H03F 3/45475; H03F 2200/405; H03F 2203/45138; H03F 3/45085; H03F 2203/04; G01J 1/44; G01J 2003/064; G01J 9/00; H04B 10/6931; H04B 10/6911; H04B 10/6933; G01N 21/5907; H04J 14/02; H04J 14/0201; A61B 2562/146; A61B 5/0059
USPC .................. 330/59, 308; 250/214 A, 214 AG
See application file for complete search history.

(56) References Cited

U.S. PATENT DOCUMENTS

| 6,038,049 | A  | * | 3/2000  | Shimizu et al. ............... 398/210 |
| 7,218,865 | B2 | * | 5/2007  | Doh et al. ..................... 398/202 |
| 7,671,680 | B2 | * | 3/2010  | Hara ............................. 330/281 |
| 7,755,434 | B2 | * | 7/2010  | Hara et al. .................... 330/308 |
| 8,054,136 | B2 | * | 11/2011 | Hara ............................. 330/308 |
| 2004/0251969 | A1 | * | 12/2004 | Abidin et al. ................. 330/308 |
| 2011/0068862 | A1 |   | 3/2011  | Komatsu |

FOREIGN PATENT DOCUMENTS

JP      2011-66751 A    3/2011

* cited by examiner

*Primary Examiner* — Khanh V Nguyen
(74) *Attorney, Agent, or Firm* — Miles & Stockbridge P.C.

(57) ABSTRACT

Provided is a transimpedance amplifier which can realize a high-speed and high-quality receiver operation in an optical communication module or a router device having the optical communication module. An offset voltage which is generated in a post amplifier for differentiating and amplifying a single-phase output signal from a pre-amplifier in accordance with single-phase differentiation and conversion is cancelled by detecting a threshold voltage from an output of the pre-amplifier or an output of the post amplifier by a threshold detection circuit and by shifting a level of the threshold voltage corresponding to an offset amount to be compensated.

13 Claims, 8 Drawing Sheets

$f1 = 1/(2\pi \times R3 \times C3)$
$f2 = f1 \times G2 \times G3$
$f3 = f1 \times G2 \times G3'$ $f1 = 1/(2\pi \times R3 \times C3)$
$f2 = f1 \times G2 \times G3$
$f3 = f1 \times G2 \times G3'$

TRANSIMPEDANCE AMPLIFIER

BACKGROUND OF THE INVENTION

1. Field of the Invention

The present invention relates to a transimpedance amplifier, an optical communication module and an optical communication apparatus which includes the optical communication module, and more particularly to an optical communication apparatus such as a router or a server and a high sensitive transimpedance amplifier which is part of the optical communication apparatus and is effectively applicable to an optical communication module which performs optical communication using a laser diode and a photo diode.

2. Description of the Related Art

For example, JP-A-2011-66751 (patent literature 1) discloses a transimpedance amplifier which converts a current signal from a photo diode into a voltage signal and amplifies the voltage signal in a high-speed optical receiver circuit. To be more specific, patent literature discloses the transimpedance amplifier which is constituted of a pre-amplifier, a post-amplifier, an error amplifier, and an auto-threshold voltage control circuit, wherein a negative feedback path is formed by the post-amplifier, the error amplifier, and an automatic threshold voltage control circuit so that an offset voltage of the post-amplifier can be reduced by a gain of the negative feedback path.

Recently, along with a demand for a higher communication speed, the communication speed has been increased to 25 Gbps, 40 Gbps or the like from 10 Gbps. To cope with such a demand for a higher communication speed, the application of an optical communication apparatus corresponding to an optical fiber cable to a router device or a server device, for example, has been steadily progressing. The optical communication apparatus is usually designed on a premise that the optical communication apparatus is used for the long distance transmission at the order of kilometers between devices, and it is important to ensure the high speed property and reliability in such long distance transmission.

Among such optical communication apparatuses, there have been known many devices which have a relatively large size (for example, the order of several tens of centimeters to the order of meters). Inside of these apparatuses, usually, the communication is performed using an electrical signal. That is, the optical communication apparatus, for example, converts an optical signal inputted from the outside into an electrical signal, performs predetermined processing through short distance communication (for example, of the order of meters) in the inside of the apparatus using the electrical signal, and converts the electrical signal again into an optical signal, and outputs the optical signal to the outside. In such short distance communication, communication by an electrical signal is performed using a copper line cable or the like, for example. However, along with the demand for a higher communication speed, quality of a transmission waveform is remarkably deteriorated when the communication is performed using the copper line cable. To cope with such a situation, a demand for using optical communication also in such short distance communication in the inside of the apparatus has been increasing. In this case, in the optical communication, all internal signal-processings in a router or the like are performed using an electrical signal and hence, it is necessary to convert an optical signal into an electrical signal by an optical element. Accordingly, it is desirable to suppress electric power consumed by such a portion to a small value.

FIG. 1A shows an image view of the constitution of a router apparatus where an optical communication module is applied to communication between cards. In this constitution, optical communication is performed between LSI_LGi mounted on interface cards IFC[1], IFC[2] and switches LSI_LGs mounted on a switch card SWC by optical communication modules OMDi, OMDs, optical connectors CNc, CNo and optical fibers OF.

FIG. 1B shows the constitution of the optical communication module. The optical communication module OMD is constituted of an optical element block OBK including a laser diode LD and a photodiode PD, an analogue front end circuit AFE including a laser diode driver LDD and a transimpedance amplifier TIA, and an electric interface block SDC connected with an LSI. To explain the transmission operation of the optical communication module OMD, the laser driver LDD which receives an electrical signal from the electric interface block SDC drives the laser diode LD in response to a current signal so that an optical signal is outputted to an optical fiber OFtx from the laser diode LD.

On the other hand, to explain the receiver operation of the optical communication module OMD, an optical signal from an optical fiber OFrx is converted into a current signal by a photodiode PD, and the current signal is converted into a voltage signal by the transimpedance amplifier TIA and the voltage signal is transmitted to the electric interface block SDC. To suppress electric power consumed by a series of optical communication operations, it is important to suppress optical signal energy to be transmitted or received to a small value, and it is also important to suppress electric power consumed by the optical element block OBK and the analogue front end circuit AFE.

The suppression of the optical signal energy to be transmitted or received or electric power consumed by the laser LD to a small value leads to the suppression of energy of the optical signal which the photodiode PD receives so that an input current signal of the transimpedance amplifier TIA can be reduced. In general, the input current signal of the transimpedance amplifier TIA is a minute current of not more than several 100 µA. In future, to cope with the further lowering of electric power for in-device optical transmission, it is necessary to further lower the level of a receivable input current signal.

As a gain GTIA of the transimpedance amplifier TIA, approximately 1KΩ is necessary for ensuring several 100 mV necessary for operating the electric interface block SDC of a succeeding stage as an output voltage signal. The transimpedance amplifier TIA converts an electric current into a voltage with amplification and hence, a unit of a gain becomes Ω (Vo=GTIA*Iin).

FIG. 2A shows the block constitution of the transimpedance amplifier TIA described in patent literature 1. The transimpedance amplifier TIA includes a pre-amplifier PRAMP which converts a single-phase current signal from the photodiode PD into a voltage signal, a post-amplifier PSAMP which differentiates and amplifies a single-phase output signal from the pre-amplifier PRAMP, and an error amplifier ERAMP and an auto-threshold voltage control circuit ATC1 which detect a signal center level (signal threshold voltage) based on an output signal from the post-amplifier PSAMP. A gain of the pre-amplifier PRAMP is G1, a gain of the post-amplifier PSAMP is G2, and the gain GTIA of the whole transimpedance amplifier TIA is G1×G2 (GTIA=G1×G2).

The error amplifier ERAMP includes an operational amplifier OPAMP and resistors R1, R2, and a gain G3 of the error amplifier ERAMP is R2/R1 (G3=R2/R1). The auto-threshold voltage control circuit ATC1 is a primary low pass filter having a resistor R3 and a capacitor C3, and cut-off frequency f1 of the auto-threshold voltage control circuit ATC is $1/(2\pi \times R3 \times C3)$ (f1=$1/(2\pi \times R3 \times C3)$).

Although it is necessary to increase the gain G1 of the initial-stage pre-amplifier PRAMP to enhance light receiver sensitivity of the transimpedance amplifier TIA, the gain G1 and an operational bandwidth have a tradeoff relationship. Accordingly, for example, to set the operational bandwidth to several GHz or more, the gain G1 of the pre-amplifier PRAMP must be held only at a level of approximately several 100Ω.

As described previously, the input current signal of the transimpedance amplifier TIA is approximately several 100 μA and hence, the output signal from the pre-amplifier PRAMP becomes approximately several 10 mV. The post-amplifier PSAMP includes a differential circuit in general and hence, an offset voltage Voff of approximately several 10 mV is generated at an input of the post-amplifier PSAMP due to irregularities in a pair transistor or load resistance. Particularly, when a field effect transistor (hereinafter abbreviated as MOS transistor) which is effectively used for high-speed communication and low power consumption is used, a value of the offset voltage Voff is large and hence, the output signal of the pre-amplifier PRAMP has substantially the same voltage as the offset voltage Voff whereby a high-quality current/voltage signal conversion operation is impaired by the offset voltage Voff.

To compensate for this offset voltage Voff, in patent literature 1, a negative feedback path is formed of the post-amplifier PSAMP, the error amplifier ERAMP and the auto-threshold voltage control circuit ATC1. An open loop gain Gopen of the negative feedback path is G2×G3 (Gopen=G2×G3). Due to the provision of the negative feedback path, the offset voltage Voff is reduced by an amount corresponding to the open loop gain Gopen so that the offset voltage Voff' is Voff/Gopen (Voff'=Voff/Gopen).

FIG. 2B shows frequency characteristics of an open loop of the negative feedback path and the transimpedance amplifier TIA. In FIG. 2B, the open loop gain Gopen of the feedback circuit is taken on a left axis of ordinates, and the gain GTIA of the transimpedance amplifier TIA is taken on a right axis of ordinates. Although the open loop gain Gopen becomes constant at G2×G3 in a low frequency region, when the frequency exceeds f1, the open loop gain Gopen is decreased with inclination of 20 dB/dec due to a characteristic of the low pass filter of the auto-threshold voltage control circuit ATC1. On the other hand, although the gain GTIA of the transimpedance amplifier TIA is constant at G1×G2 in a high frequency region, a unity gain frequency f2 at which the gain of the negative feedback path becomes 1 is f1×G2×G3 (f2=f1×G2×G3) and hence, the gain GTIA is decreased with the inclination of 20 dB/dec in a region where the frequency is not more than f2.

Accordingly, the low cutoff frequency of the transimpedance amplifier TIA is determined based on the unity gain frequency f2 of the negative feedback path. To realize the low power consumption and the reduction of noises of the transimpedance amplifier TIA, it is necessary to decrease the number of stages of amplifiers which constitute the post-amplifier PSAMP by increasing the gain G1 of the pre-amplifier PRAMP and by lowering the gain G2 necessary for the post-amplifier PSAMP.

Accordingly, the gain G2 of the post-amplifier PSAMP is approximately 10 times, and it is necessary to increase the gain G3 of the error amplifier ERAMP to G3' to enhance the compensation accuracy of the offset voltage Voff. However, when the gain of the error amplifier ERAMP is increased, a unity gain frequency f3 of the negative feedback path is also increased to f1×G2×G3' (f3=f1×G2×G3'). As a result, the low cutoff frequency of the transimpedance amplifier TIA is increased to f3 from f2.

In general, the low cutoff frequency of the transimpedance amplifier TIA is required to be not more than 100 KHz. The capacitor C3 which can be mounted in a chip is approximately 100 pF due to the restriction imposed on an area which can be formed on a semiconductor and hence, the low pass filter characteristic of the auto-threshold voltage control circuit ATC1 is limited to approximately 100 kHz. Accordingly, due to the restriction imposed on required lower-region cutoff frequency of the transimpedance amplifier TIA, it is difficult to enhance the compensation accuracy of the offset voltage Voff with the increase of the gain G3 of the error amplifier ERAMP, and the offset voltage Voff becomes approximately ⅒. Accordingly, with the output of the pre-amplifier PRAMP, the offset voltage Voff of several mV is generated with respect to a receiver signal of several 10 mV and hence, a rate of the offset voltage Voff with respect to the receiver signal exceeds several 10% whereby it is difficult to realize the high-quality and high-speed receiver operation of several Gbsp or more.

SUMMARY OF THE INVENTION

The present invention has been made in view of the above-mentioned circumstances, and it is an object of the present invention to provide an optical receiver circuit and an optical communication system which can realize a higher communication speed.

To briefly explain the summary of typical embodiments of the invention described in this specification, they are as follows.

According to one aspect of the present invention, there is provided a transimpedance amplifier which includes a pre-amplifier which converts a single-phase current signal from a photodiode into a voltage signal, an error amplifier and an auto-threshold voltage control circuit which detect a signal center level (signal threshold voltage) based on an output signal from the pre-amplifier, and a post-amplifier which differentiates and amplifies a single-phase output signal from the pre-amplifier, wherein the auto-threshold voltage control circuit includes a means having an offset voltage cancelling function which allows an output from an average value detection circuit such as a low pass filter for detecting a threshold value to perform minute level shifting of a voltage. Due to such a constitution, an offset voltage which is generated by the post-amplifier at the time of receiver operation can be canceled so that receiver sensitivity can be enhanced.

The above-mentioned "means having an offset voltage cancelling function", can be a voltage follower circuit, for example.

To briefly explain advantageous effects acquired by typical embodiments of the invention described in this specification, in an optical communication module, a high-speed and high-quality receiver operation can be realized by canceling an offset voltage of a post-amplifier generated at the time of receiver operation.

BRIEF DESCRIPTION OF THE DRAWINGS

FIG. 1A and FIG. 1B are block diagrams showing a router device according to an embodiment 1 of the present invention, and an optical communication module for performing communication between cards arranged in the inside of the router device, wherein FIG. 1A shows one example of the schematic constitution of the inside of the router device, and FIG. 1B shows one example of the schematic constitution of the optical communication module;

FIG. 7A and FIG. 7B are circuit diagrams of the transimpedance amplifiers shown in FIG. 3A and FIG. 4, wherein FIG. 7A shows an example where a regulated cascade-type current/voltage amplifier circuit is used as a pre-amplifier, and FIG. 7B shows an example where a differential circuit is used as a post-amplifier;

DETAILED DESCRIPTION

Figure 1A:
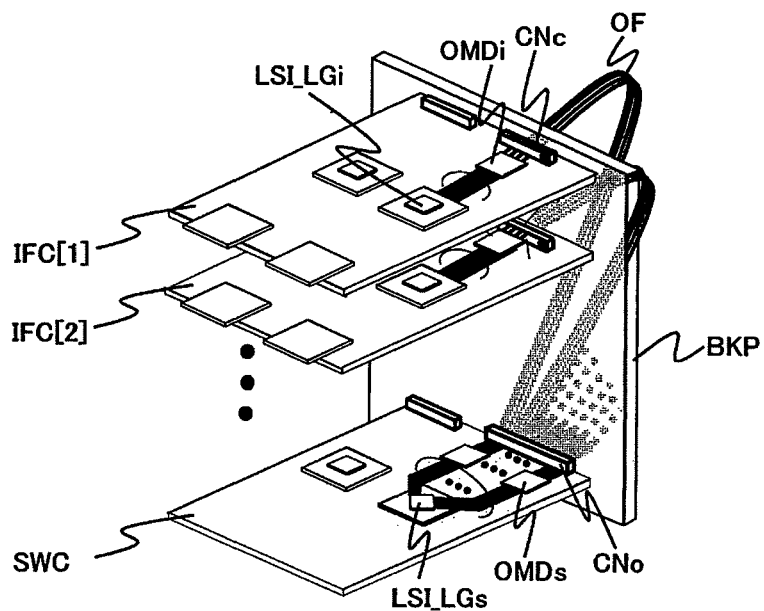

In the below-described embodiments, a description will be made after divided in plural sections or in plural embodiments if necessary for convenience's sake. These plural sections or embodiments are not independent of each other, but in a relation such that one is a modification example, details or complementary description of a part or whole of the other one unless otherwise specifically indicated. In the below-described embodiments, when a reference is made to the number of elements (including the number, value, amount and range), the number is not limited to a specific number but can be greater than or less than the specific number unless otherwise specifically indicated or in the case it is principally apparent that the number is limited to the specific number.

Moreover, in the following embodiments, constituent elements (including elemental steps) are not always essential unless otherwise specifically indicated or principally apparent that the element is essential. Similarly, in the following embodiments, when a reference is made to the shape or positional relationship of the constituent elements, that substantially analogous or similar to it is also embraced unless otherwise specifically indicated or principally apparent that it is not. This also applies to the above-described value and range.

Also, the circuit elements constituting each functional block of the embodiment are not particularly limited, but are formed on a semiconductor substrate such as that made of single crystal silicon by the known integrated circuit technology of CMOS (complementary MOS transistor) and others. In the embodiments, as an example of an MISFET (Metal Insulator Semiconductor Field Effect Transistor), an MOS-FET (Metal Oxide Semiconductor Field Effect Transistor) (abbreviated as an MOS transistor) is employed. However, a non-oxide film is not excluded from the use as a gate insulating film. Connection of substrate potential of the MOS transistor is not specified in the drawings in particular. However, the method of the connection will not be restricted as long as the MOS transistor can operate normally.

The embodiments of the present invention will hereinafter be described specifically referring to accompanying drawings. In all the drawings for describing the below-described embodiments, members having like function will be identified by like reference numerals and overlapping descriptions will be omitted.

Embodiment 1

Figure 1B:
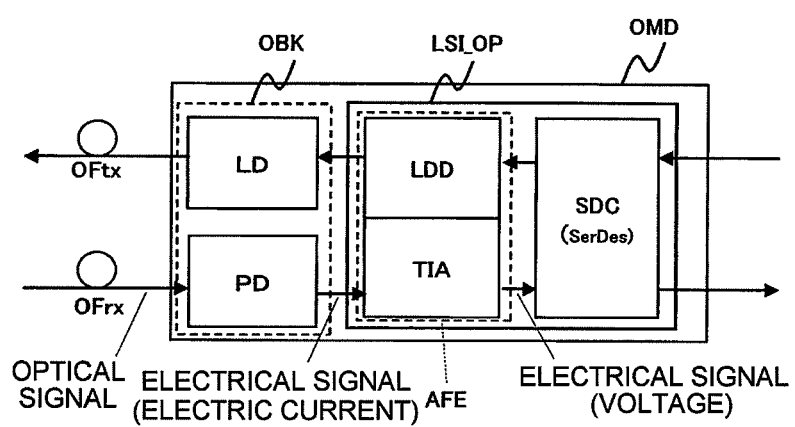
Figure 3A:
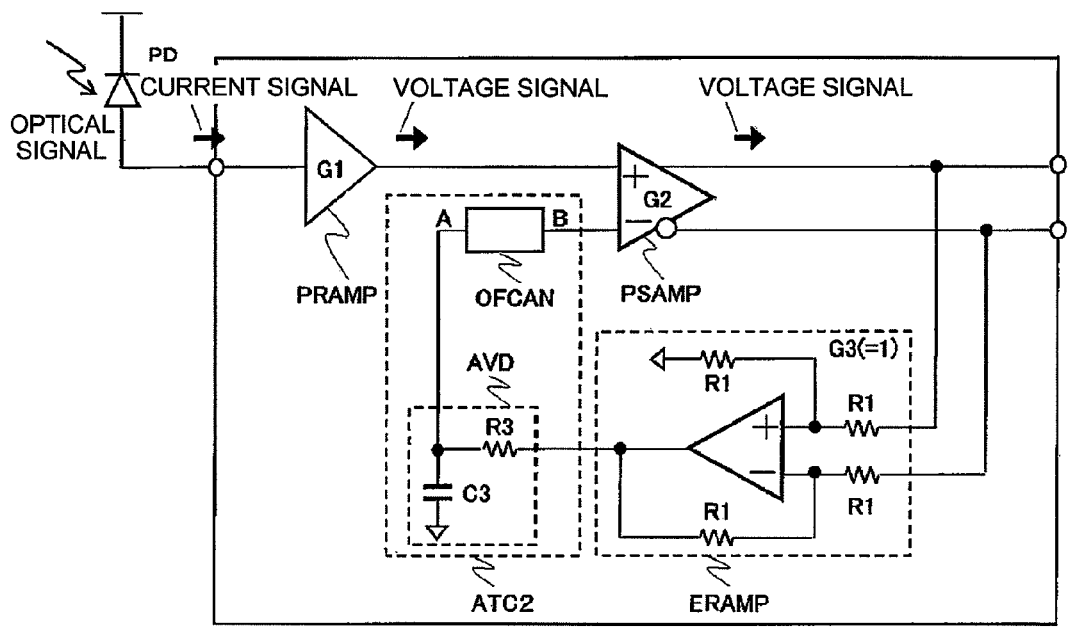
FIG. 3A is a block diagram showing an example of a transimpedance amplifier constituting the receiver system in FIGS. 1A and 1B where an auto-threshold voltage control circuit is constituted of an average value detection circuit and an offset cancellation circuit, and an offset voltage of a post-amplifier is canceled by shifting a level of an output voltage of the auto-threshold voltage control circuit.

FIG. 3A shows an example of a transimpedance amplifier of the present invention which is part of a receiver system shown in FIGS. 1A and 1B.

Figure 3B:
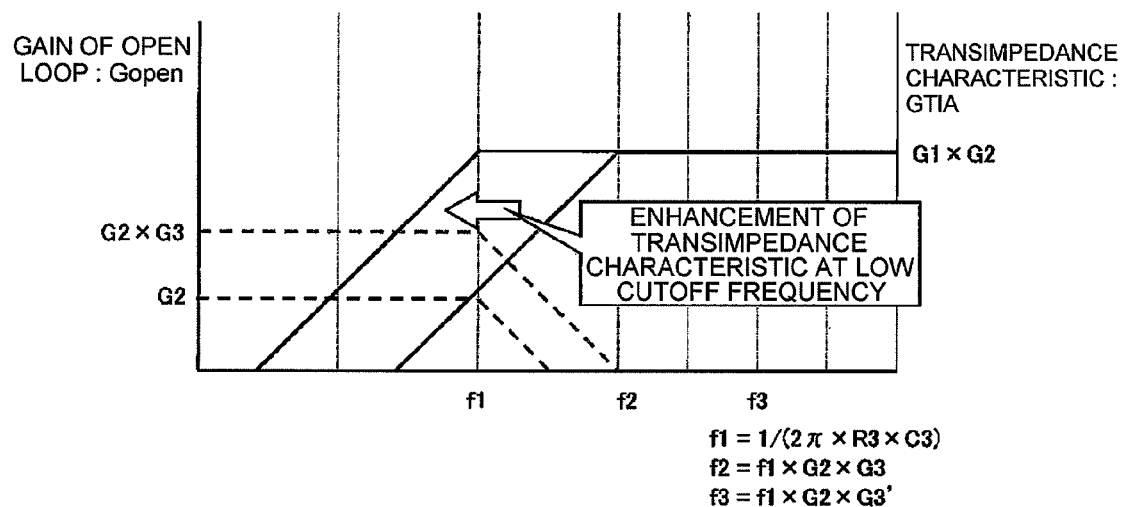
FIG. 3B is a graph showing frequency characteristics of an open loop and the transimpedance of the transimpedance amplifier of FIG. 3A.

FIG. 3A shows the block constitution where an offset voltage Voff generated in a post-amplifier PSAMP is compensated by an offset cancellation circuit OFCAN in an auto-threshold voltage control circuit ATC2, and FIG. 3B shows frequency characteristics of an open loop and transimpedance in such a constitution. The transimpedance amplifier of this embodiment is constituted of a pre-amplifier PRAMP which converts a single phase current signal from a photodiode PD into a voltage signal, the post-amplifier PSAMP which differentiates and amplifies a single phase output signal from the pre-amplifier PRAMP, and an error amplifier ERAMP and the auto-threshold voltage control circuit ATC2 which detect a signal center level (signal threshold voltage) based on an output signal from the post-amplifier PSAMP.

Figure 2A:
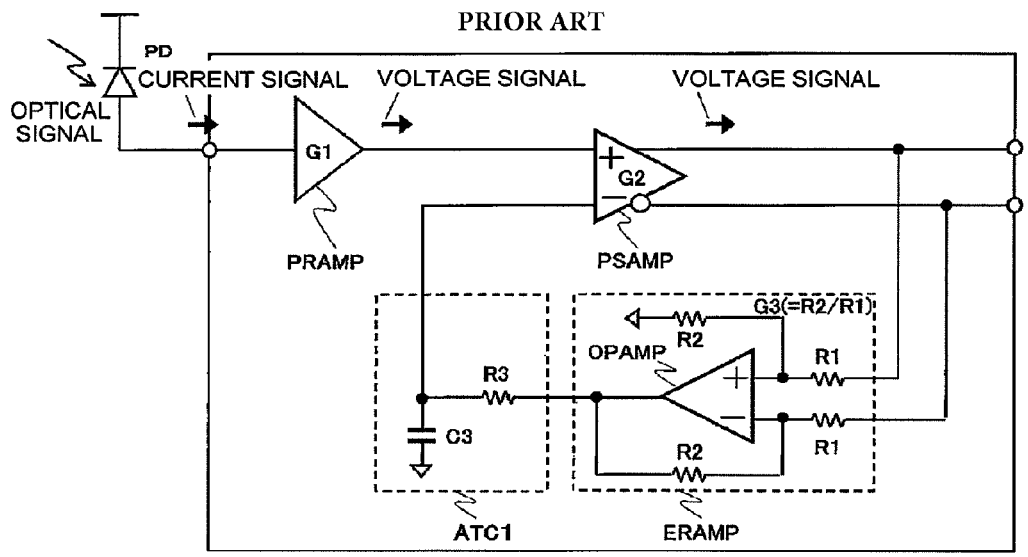
FIG. 2A is a block diagram showing a conventional example of a transimpedance amplifier constituting a part of a receiver system of FIGS. 1A and 1B.
Figure 2B:
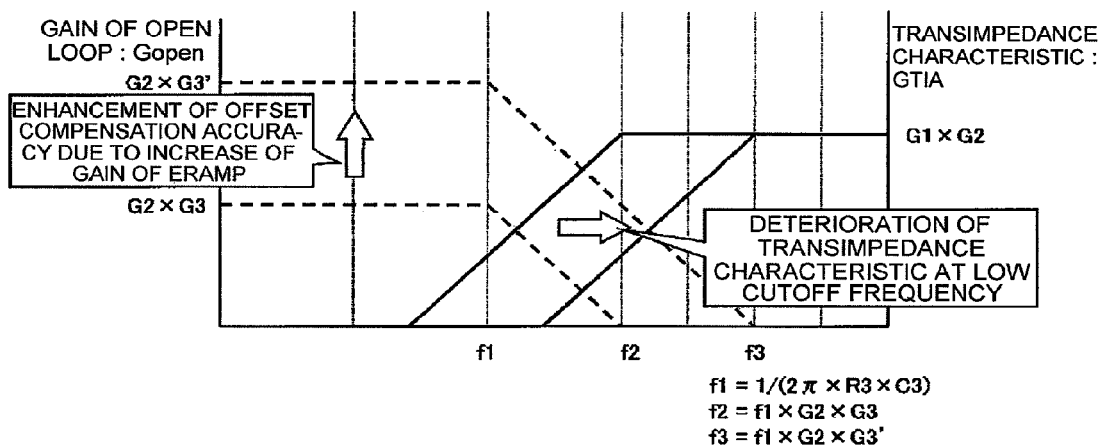
FIG. 2B is a graph showing frequency characteristics of an open loop and the transimpedance of the transimpedance amplifier of FIG. 2A.

In the embodiment shown in FIG. 3A, an auto-threshold voltage control circuit ATC1 shown in FIG. 2A is replaced with the auto-threshold voltage control circuit ATC2, and the auto-threshold voltage control circuit ATC2 includes an average value detection circuit AVD and an offset cancellation circuit OFCAN. The average value detection circuit AVD is formed of a low pass filter which includes resistor R3 and a capacitor C3, and the average value detection circuit AVD detects a threshold voltage of an output signal from the error amplifier ERAMP. The average value detection circuit AVD is not limited to the low pass filter and, for example, the signal center level may be determined by detecting a peak of the output signal from the error amplifier ERAMP.

The offset cancellation circuit OFCAN is a circuit having a function of shifting a level of a voltage of an output signal from the average value detection circuit AVD. The level of the voltage of the output signal from the average value detection circuit AVD is shifted by the offset cancellation circuit OFCAN by an amount corresponding to an offset voltage −Voff having a characteristic opposite to a characteristic of the offset voltage Voff generated by the post-amplifier so that the offset voltage can be compensated. With the provision of the auto-threshold voltage control circuit ATC2, as shown in FIG. 3B, the offset voltage can be compensated with high accuracy without increasing a gain G3 of the error amplifier ERAMP and without deteriorating characteristics of the transimpedance amplifier TIA at low cutoff frequency.

As described above, with the use of an optical communication module or a router device which includes the transimpedance amplifier of the embodiment 1, the high-speed and high-quality receiver operation Embodiment 2

Figure 4:
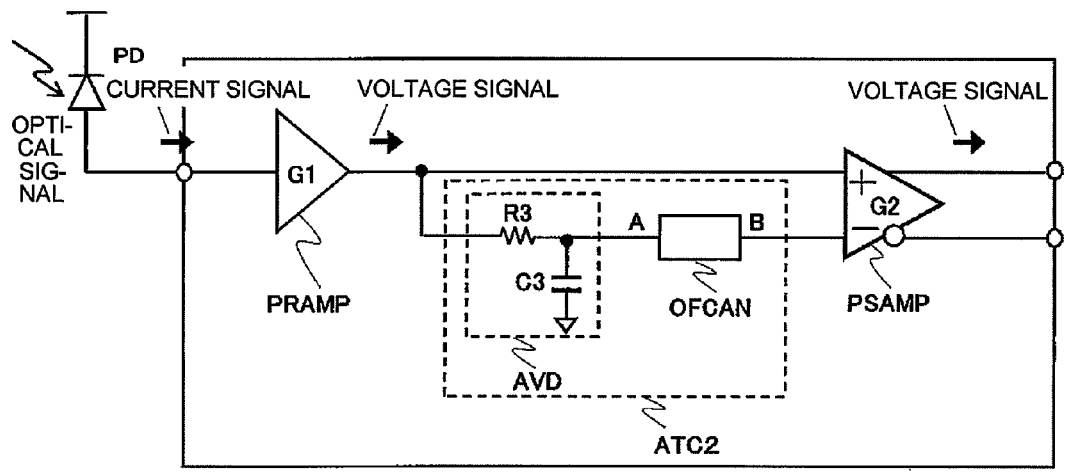
FIG. 4 is a block diagram showing the transimpedance amplifier of FIG. 3A where an offset voltage of a post-amplifier is canceled by an offset cancellation circuit in an auto-threshold voltage control circuit which detects a threshold value based on an output signal from a pre-amplifier.

FIG. 4 shows the transimpedance amplifier TIA shown in FIG. 3A where the transimpedance amplifier TIA includes the auto-threshold voltage control circuit ATC2 which detects a threshold voltage based on an output signal from the pre-amplifier PRAMP, and the post-amplifier PSAMP which differentiates and amplifies a single phase output from the pre-amplifier PRAMP.

As described previously, the auto-threshold voltage control circuit ATC2 includes the average value detection circuit AVD and the offset cancellation circuit OFCAN, and the offset cancellation circuit OFCAN has a function of shifting a level of a voltage of an output signal from the average value detection circuit AVD. By shifting the level of the voltage of the output signal from the average value detection circuit AVD by an amount corresponding to the voltage −Voff having a characteristic opposite to a characteristic of the offset voltage Voff generated in the post-amplifier PSAMP by the offset cancellation circuit OFCAN, both voltages cancel each other so that the offset voltage Voff can be compensated.

Figure 5:
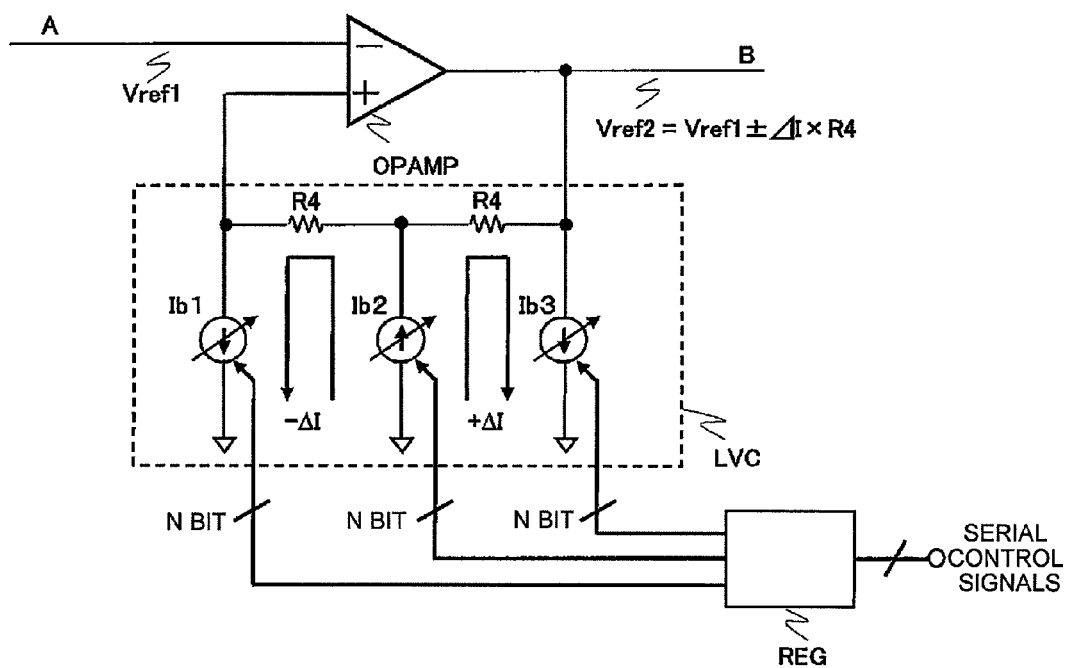
FIG. 5 is a block diagram showing an example of the offset cancellation circuit of the transimpedance amplifier shown in FIG. 3A and FIG. 4 where a level of a threshold value is shifted by constituting an offset cancellation circuit by a voltage follower which uses an operational amplifier.

FIG. 5 shows an example of the offset cancellation circuit OFCAN in the transimpedance amplifier TIA shown in FIG. 3A and FIG. 4. The offset cancellation circuit OFCAN is constituted of an operational amplifier OPAMP, a level shift part LVC having a means which shift a level of a voltage, and a memory or a register REG having a means which stores a set value for the level shift part. In the example shown in FIG. 5, a negative feedback path is configured such that an output terminal of the operational amplifier OPAMP is connected to a positive-pole input terminal of the operational amplifier OPAMP via the level shift part LVC thus forming a voltage follower.

In the voltage follower, when a gain of the operational amplifier OPAMP is sufficiently high, with a negative-pole input voltage of the operational amplifier OPAMP set to Vref1, an output voltage Vref2 of the operational amplifier OPAMP becomes Vref1 (Vref2=Vref1). The level shift part LVC is constituted of two resistors R4 which are connected in series between input and output terminals of the operational amplifier OPAMP, and three constant current sources Ib1, Ib2, Ib3 whose currents can be set to desired values respectively. A level of a threshold voltage is shifted by desirably setting a current value −ΔI or −ΔI of each current source. In shifting the level of the threshold voltage to a negative pole, an electric current −ΔI is flown into the resistor R4 in the direction from the constant current source Ib2 to the constant current source Ib1 so that level shifting of a voltage −ΔI×R4 can be realized whereby the output level Vref2 of the offset cancellation circuit OFCAN becomes Vref1−ΔI×R4 (Vref2=Vref1−ΔI×R4).

Figure 9:
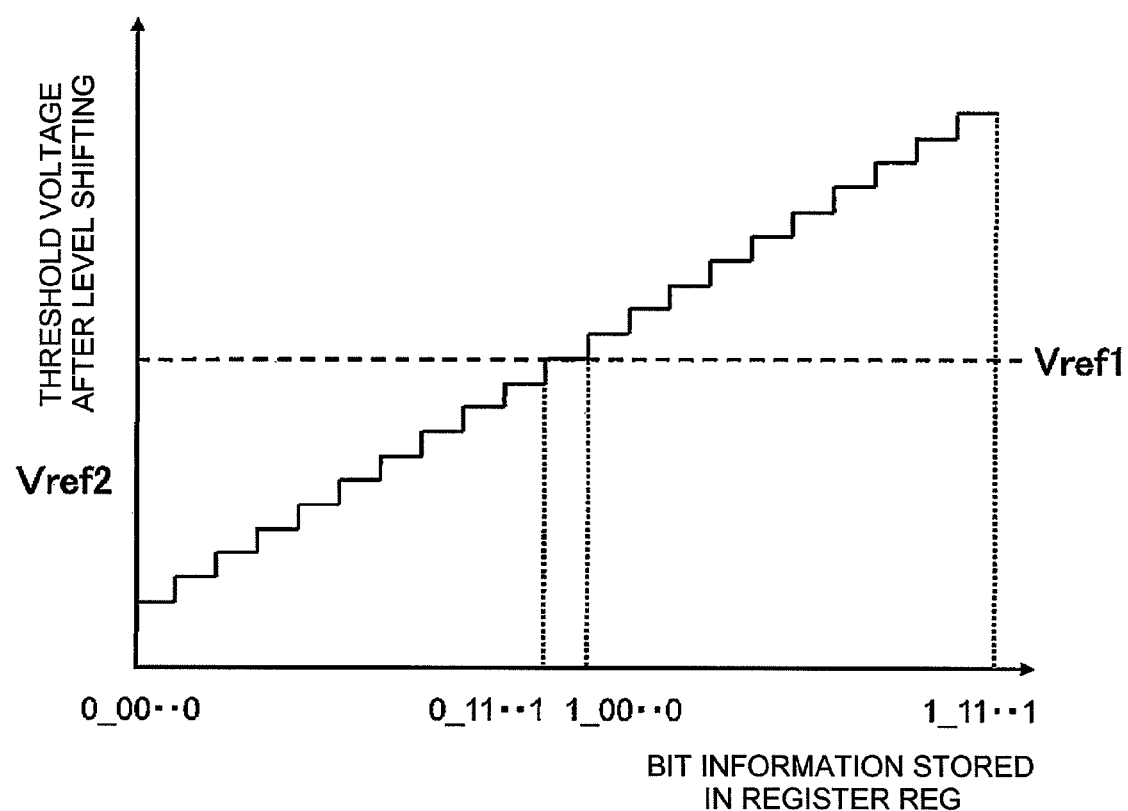
FIG. 9 is an explanatory view showing a threshold voltage after level shifting of a voltage in the offset cancellation circuit shown in FIG. 5 with respect to a value in a setting register.

On the other hand, in shifting the level of the threshold voltage to a positive pole, an electric current AI is flown into the resistor R4 in the direction from the constant current source Ib2 to the constant current source Ib3 so that level shifting of a voltage ΔI×R4 can be realized whereby the output level Vref2 of the offset cancellation circuit OFCAN becomes Vref1+ΔI×R4 (Vref2=Vref1+ΔI×R4). As shown in FIG. 9, set values of the constant current sources are stored in the memory or the register REG, and an output level of the output voltage Vref2 is adjusted corresponding to bit information in the register REG. Further, the set values are changed in response to external serial control signals or the like.

Embodiment 4

Figure 6:
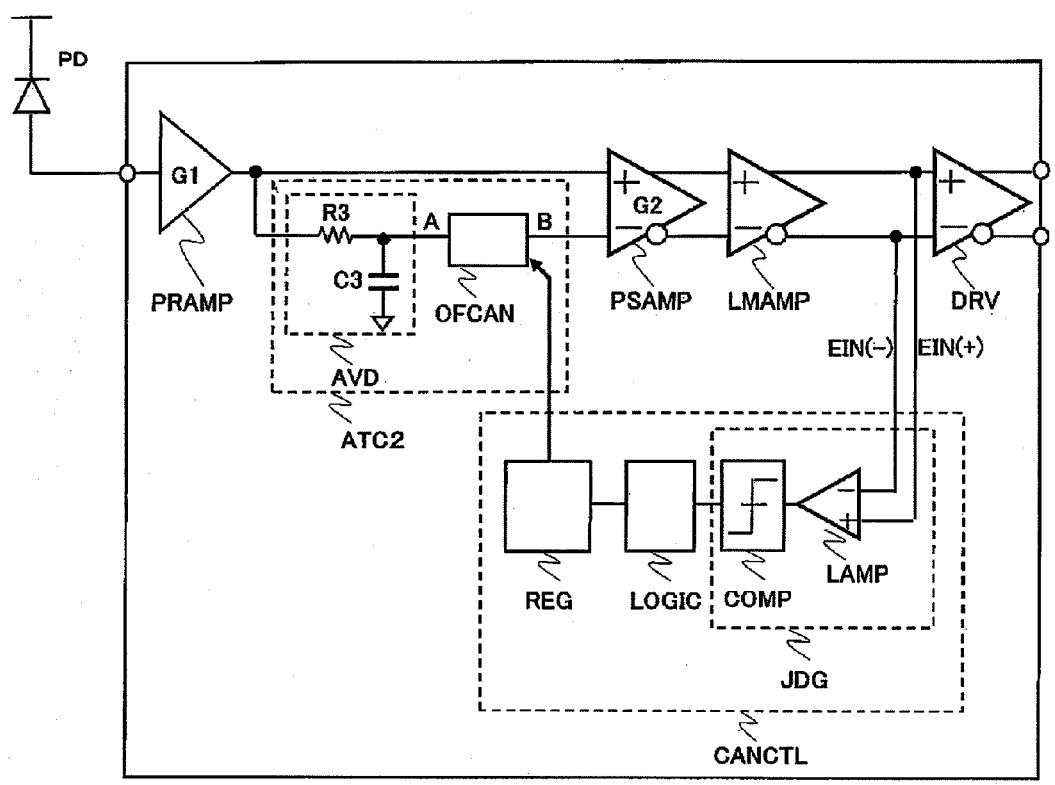
FIG. 6 is a block diagram showing an example of an offset amount adjusting block of the transimpedance amplifier shown in FIG. 4 where a level shifting value in an offset cancellation circuit is determined by an offset cancellation logic block based on an output from a limit amplifier.

FIG. 6 shows the transimpedance amplifier TIA shown in FIG. 4 where the adjustment of an offset amount of the offset cancellation circuit OFCAN is performed by an offset amount adjusting block CANCTL provided to the transimpedance amplifier TIA.

When an analogue front end circuit block AFK and a transmission speed conversion circuit SDC are mounted using semiconductor chips different from each other or the like, a limit amplifier LMAMP which sets an output voltage to a fixed value is connected to an output of the post amplifier PSAMP, and an electrical driver DRV for driving an output load of 50Ω between the analogue front end circuit block AFK and the transmission speed conversion circuit SDC is connected to an output of the limit amplifier LMAMP.

The limit amplifier LMAMP can set the output voltage of the transimpedance amplifier TIA to a fixed value irrespective of magnitude of an input signal of the pre-amplifier PRAMP and hence, the limit amplifier LMAMP can be effectively used also in a case where the analogue front end circuit block AFK and the transmission speed conversion circuit SDC are integrated with each other.

The offset amount adjusting block CANCTL is constituted of an offset amount detection circuit JDG, a control logic circuit LOGIC, and the memory or the resistor REG.

The adjustment of an offset amount is performed in a state where an output level of the pre-amplifier PSAMP is set to a fixed value by stopping an optical signal or by inputting a DC-like optical signal or the like.

When the offset voltage Voff is generated in the post-amplifier PSAMP or the limit amplifier LMAMP, a differential voltage ΔV (ΔV=EIN(+)−EIN(−)) is generated between an output EIN(+) and an output EIN(−) of the limit amplifier LMAMP. The offset amount detection circuit JDG detects this differential voltage ΔV, and when the differential voltage ΔV is generated, the offset amount detection circuit JDG outputs a determination signal to the control logic circuit LOGIC.

The offset amount detection circuit JDG is constituted of a low offset amplifier LAMP and a comparator COMP. In detecting the differential voltage ΔV generated by the offset voltage Voff, there is a possibility that the detection accuracy is deteriorated due to the offset voltage generated due to irregularities in a transistor which constitutes the comparator COMP.

To cope with such a possibility, the low offset amplifier LAMP of a high gain having an offset canceling function such as an auto zero method or a chopper method is connected to the comparator COMP at a preceding stage so that the differential voltage ΔV is amplified in advance whereby the detection accuracy of the offset amount detection circuit JDG is enhanced. The control logic circuit LOGIC rewrites the set values in the register REG corresponding to a detection result of the offset amount detection circuit JDG. As a result, the offset voltage Voff generated in the post-amplifier PSAMP or the limit amplifier LMAMP can be compensated.

This adjustment is performed before the optical communication, and the output EIN(+) and the output EIN(−) of the limit amplifier LMAMP are separated from the offset amount adjusting block CANCTL by a switch or the like at the time of optical communication.

Embodiment 5

Figure 7A:
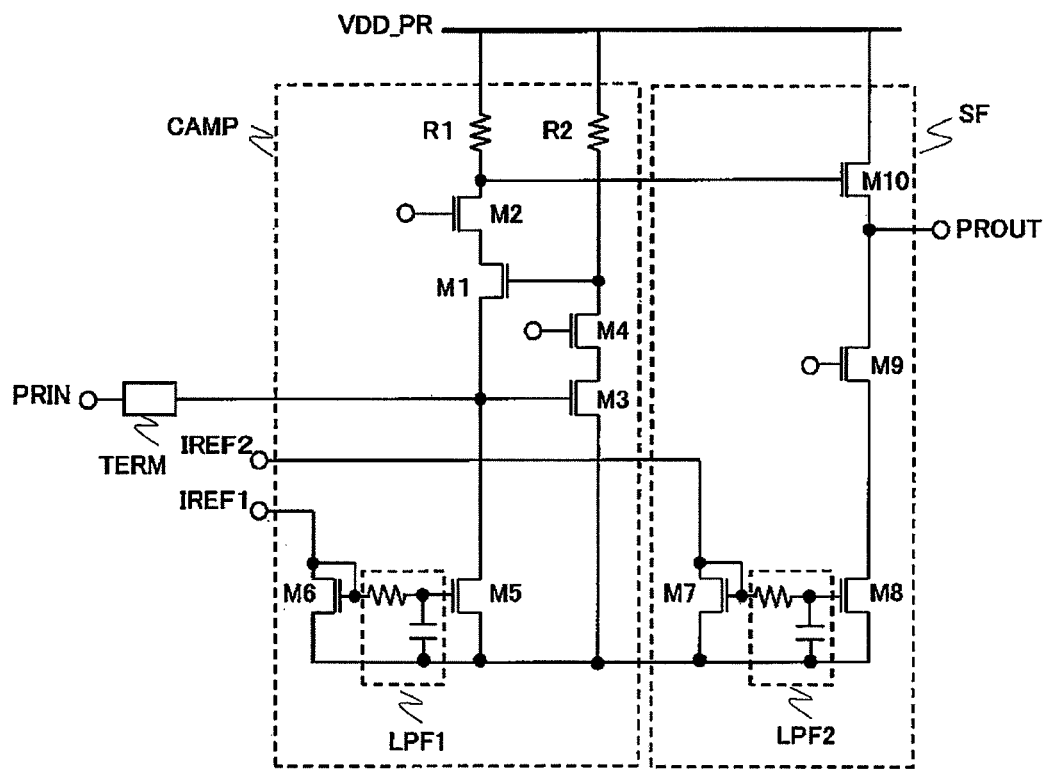
Figure 7B:
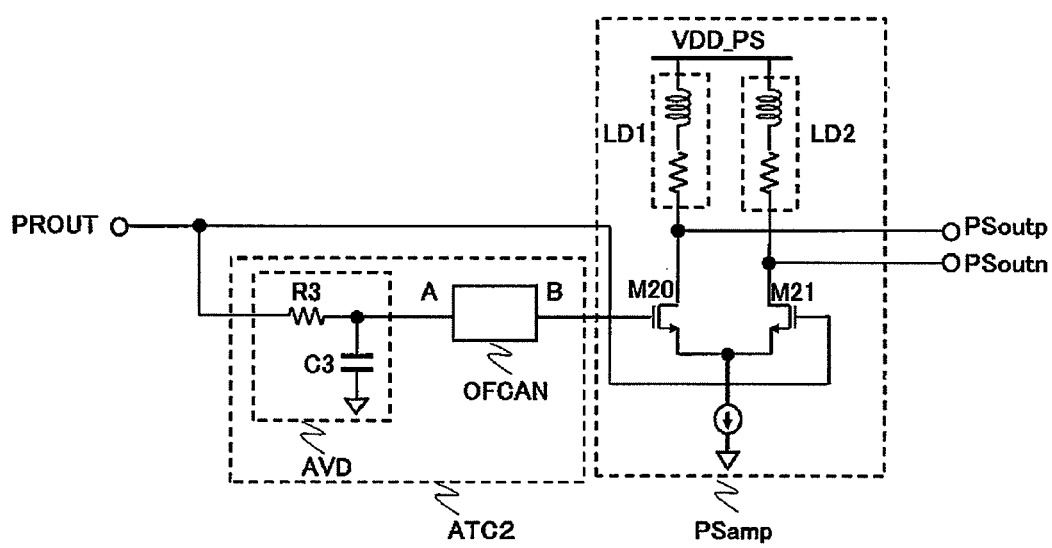

FIGS. 7A and 7B show examples of specific circuit included in the transimpedance amplifier described in the embodiment 2 of the present invention.

FIG. 7A shows an example of the pre-amplifier circuit PRAMP. In the pre-amplifier circuit PRAMP, an electric current which flows into an input terminal PRIN is subjected to a current/voltage conversion in a cascade-type amplifier CAMP at an initial stage, and the electric current is outputted as a voltage signal by a source follower circuit SF at a succeeding stage. The cascade-type amplifier CAMP realizes a high gain and a high band by performing a positive feedback of an output of an amplifier circuit constituted of a resistor R2 and field effect transistors M3, M4 to a field effect transistor M1 of an amplifier circuit at an initial stage constituted of a resistor R1, field effect transistors M1, M2, and a constant-current-source field effect transistor M5.

A current mirror circuit constituted of field effect transistors M5, M6, and a low pass filter LPF1 determines an operation point of the amplifier circuit CAMP at an initial stage based on an electric current of a reference current terminal IREF1. A terminal resistance means TERM is provided for impedance matching with a transmission path connected to an input terminal PRIN. The low pass filter LPF1 particularly eliminates low-band noise components of the reference current terminal. Also in the source follower circuit SF, a current mirror circuit constituted of field effect transistors M7, M8 and a low pass filter LPF2 determines an operation point of the source follower circuit SF based on an electric current of a reference current terminal IREF2.

FIG. 7B shows an example of the auto-threshold voltage control circuit ATC2 and the post-amplifier circuit PSAMP. In this example, the high band is realized by loads LD1, LD2 of a differential amplifier circuit using inductance and resistance. In the post-amplifier PSAMP, an output signal of the pre-amplifier PRAMP is applied to one input of the post-amplifier PSAMP, and a center potential of the output signal of the pre-amplifier circuit PRAMP generated by the auto-threshold voltage control circuit ATC2, that is, a threshold voltage is applied to another input of the post-amplifier PSAMP, and a complementary output signal which is obtained by amplifying and differentiating the output signal of the pre-amplifier PRAMP is outputted from outputs PSoutp,n of the post-amplifier PSAMP.

Figure 8:
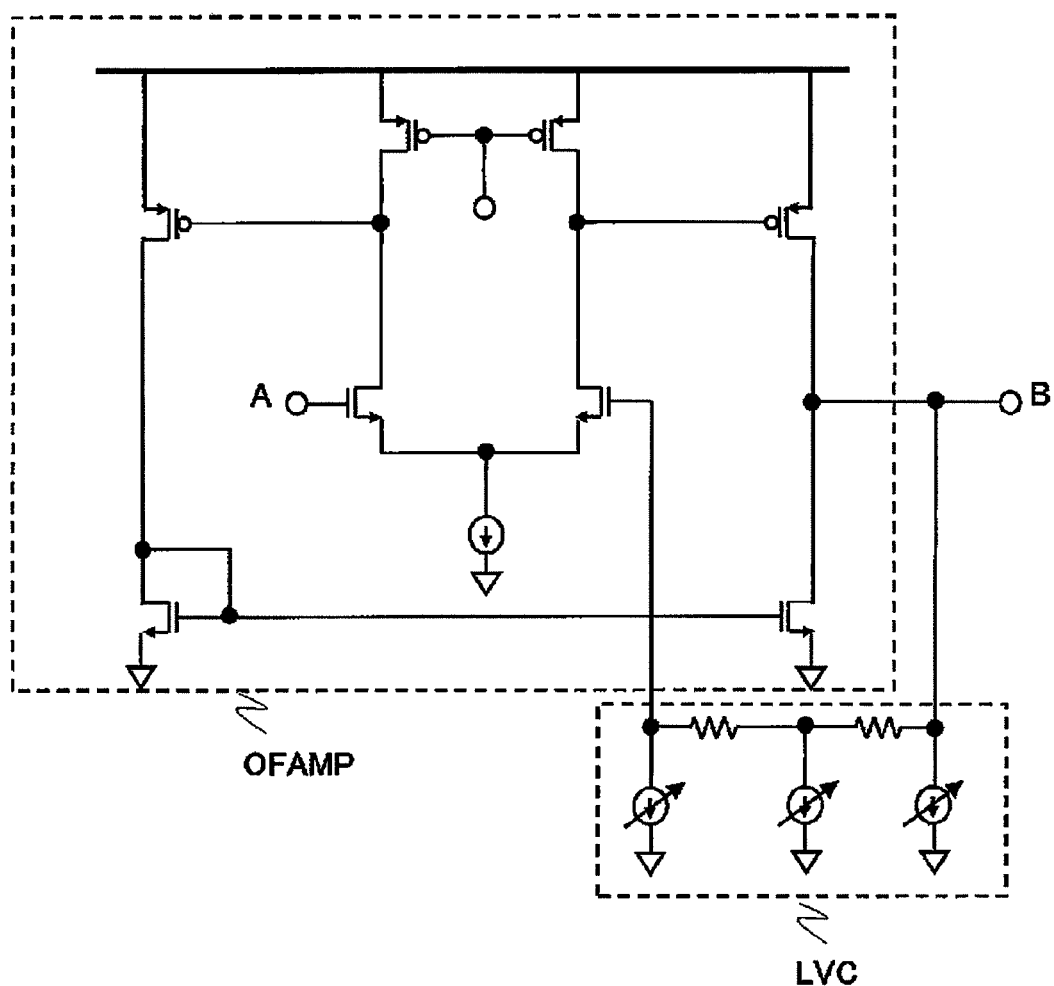
FIG. 8 is a circuit diagram showing an example of an operational amplifier which constitutes an offset cancellation circuit in the transimpedance amplifiers shown in FIG. 3A and FIG. 4.

FIG. 8 shows an example of the offset adjusting circuit OFCAN. The operational amplifier OPAMP has a general-type differential circuit constitution. The level shift part LVC is, as described above, constituted of two resistors and three constant current sources. Also in this embodiment, a threshold potential of an output signal of the pre-amplifier PRAMP can be adjusted by an auto-threshold voltage control circuit constituted of the low pass filter ADV and the offset adjusting circuit OFCAN and hence, the offset voltage of the post-amplifier can be compensated.

The optical communication module and the router device according to the embodiments of the present invention can be advantageously applied to an optical communication module and a router device where the communication through an optical fiber cable is performed in the inside of the device. Further, the present invention is not limited to such an optical communication module and a router device, and is widely applicable to products which perform optical communication using a laser diode.

What is claimed is:

1. A transimpedance amplifier circuit comprising:
    a pre-amplifier circuit;
    a post-amplifier circuit which includes one or more differential amplifier circuits arranged at a succeeding stage of the pre-amplifier circuit; and
    an auto-threshold voltage control circuit which detects a center potential of an output voltage of the pre-amplifier circuit, wherein
    the auto-threshold voltage control circuit includes a low pass filter, and an offset adjusting circuit which has an input terminal thereof connected to an output of the low pass filter, and an output terminal thereof connected to one input of the post-amplifier circuit, and
wherein
    the auto-threshold voltage control circuit includes a negative feedback loop which includes an error amplifier circuit which has an input terminal thereof connected to an output of the post-amplifier circuit and an output terminal thereof connected to the low pass filter and the offset adjusting circuit.

2. The transimpedance amplifier circuit according to claim 1, wherein the auto-threshold voltage control circuit is configured such that an input terminal of the low pass filter is connected to an output of the pre-amplifier circuit, and an output terminal of the low pass filter is connected to one input of the post-amplifier circuit via the offset adjusting circuit.

3. The transimpedance amplifier circuit according to claim 1, wherein the offset adjusting circuit includes an operational amplifier circuit which has an input terminal thereof connected to a negative-pole-side input and a level shift circuit which is configured to set a potential difference between a positive-pole-side input of the operational amplifier circuit and an output terminal of the operational amplifier circuit.

4. The transimpedance amplifier circuit according to claim 2, wherein the offset adjusting circuit includes an operational amplifier circuit which has an input terminal thereof connected to a negative-pole-side input and a level shift circuit which is configured to set a potential difference between a positive-pole-side input of the operational amplifier circuit and an output terminal of the operational amplifier circuit.

5. The transimpedance amplifier circuit according to claim 3, wherein the level shift circuit includes two resistance devices connected in series between input and output terminals of the level shift circuit, and first, second and third constant current sources which are configured to set current values at the input terminal, the output terminal, and a connection node between the two resistance devices of the level shift circuit, and current values of the first, second and third constant current sources are set to desired values thereby setting desired potential difference between an input and an output of the level shift circuit.

6. The transimpedance amplifier circuit according to claim 4, wherein the level shift circuit includes two resistance devices connected in series between input and output terminals of the level shift circuit, and first, second and third constant current sources configured to set current values at the input terminal, the output terminal, and a connection node between the two resistance devices of the level shift circuit, and current values of the first, second and third constant current sources are set to desired values thereby setting desired potential difference between an input and an output of the level shift circuit.

7. The transimpedance amplifier circuit according to claim 5, further comprising: a current adjusting circuit which sets the current values of the first, second and third constant current sources based on information in one or more registers.

8. The transimpedance amplifier circuit according to claim 6, further comprising: a current adjusting circuit which sets the current values of the first, second and third constant current sources based on information in one or more registers.

9. The transimpedance amplifier circuit according to claim 5, further comprising: an offset amount adjusting block which includes one or more registers for setting the current values of the constant current sources, an offset amount detection circuit which is connected to an output of the transimpedance amplifier circuit, and a control logic circuit which is connected to an output of the offset amount detection circuit.

10. The transimpedance amplifier circuit according to claim 6, further comprising: an offset amount adjusting block which includes one or more registers for setting the current values of the constant current sources, an offset amount detection circuit which is connected to an output of the transimpedance amplifier circuit, and a control logic circuit which is connected to an output of the offset amount detection circuit.

11. The transimpedance amplifier circuit according to claim 9, wherein the offset amount detection circuit includes a low offset amplifier, and a comparator which is connected to an output of the low offset amplifier.

12. The transimpedance amplifier circuit according to claim 10, wherein the offset amount detection circuit includes a low offset amplifier, and a comparator which is connected to an output of the low offset amplifier.

13. The transimpedance amplifier circuit according to claim 1, wherein the offset adjusting circuit includes a voltage follower circuit.

* * * * *